US012796179B2

(12) United States Patent
Cho

(10) Patent No.: US 12,796,179 B2
(45) Date of Patent: Nov. 10, 2026

(54) DISPLAY DEVICE AND METHOD OF MANUFACTURING THE SAME

(71) Applicant: Samsung Display Co., LTD., Yongin-si (KR)

(72) Inventor: Jonghwan Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 385 days.

(21) Appl. No.: 18/235,245

(22) Filed: Aug. 17, 2023

(65) Prior Publication Data

US 2024/0213413 A1 Jun. 27, 2024

(30) Foreign Application Priority Data

Dec. 26, 2022 (KR) ........................ 10-2022-0184541

(51) Int. Cl.
*H10H 20/84* (2025.01)
*H10H 20/01* (2025.01)
*H10W 90/00* (2026.01)

(52) U.S. Cl.
CPC ............ *H10H 20/84* (2025.01); *H10W 90/00* (2026.01); *H10H 20/034* (2025.01)

(58) Field of Classification Search
None
See application file for complete search history.

(56) References Cited

U.S. PATENT DOCUMENTS 10,591,652 B2 3/2020 O' Ryan
2016/0369131 A1 12/2016 Lim et al.
2017/0373281 A1* 12/2017 Park .................... H10K 59/873
2021/0033751 A1 2/2021 Hart et al.
2021/0047236 A1 2/2021 Adib et al.
2021/0126219 A1 4/2021 Lee
2021/0238085 A1 8/2021 Li et al.
2023/0180588 A1 6/2023 Choi et al.

FOREIGN PATENT DOCUMENTS

JP 6561823 B2 8/2019
JP 6843743 B2 2/2021
KR 20120057708 A 6/2012
KR 1020130059020 6/2013
KR 20170000031 A 1/2017

(Continued)

OTHER PUBLICATIONS

Office Action dated Sep. 1, 2026 in Korean Patent Application No. 10-2022-0184541, 17 pages.

*Primary Examiner* — Alexander G Ghyka

(74) *Attorney, Agent, or Firm* — CANTOR COLBURN LLP

(57) ABSTRACT

A display device includes a display panel including a substrate, a driving device disposed on the substrate, and a light emitting device disposed on the substrate and electrically connected to the driving device, a window disposed on the display panel, a printed layer disposed between the display panel and the window, where the printed layer includes a light blocking material, a first functional layer disposed between the display panel and the window, a second functional layer disposed on the window, a third functional layer disposed on the second functional layer, and a fourth functional layer disposed on the third functional layer.

16 Claims, 9 Drawing Sheets

(56) References Cited

FOREIGN PATENT DOCUMENTS

| | | | |
|---|---|---|---|
| KR | 1020200004369 | A | 1/2020 |
| KR | 20200073461 | A | 6/2020 |
| KR | 1020200091484 | | 7/2020 |
| KR | 20210052654 | A | 5/2021 |
| KR | 1020210049838 | | 5/2021 |
| KR | 20210137255 | A | 11/2021 |

* cited by examiner

DISPLAY DEVICE AND METHOD OF MANUFACTURING THE SAME

This application claims priority to Korean Patent Application No. 10-2022-0184541, filed on Dec. 26, 2022, and all the benefits accruing therefrom under 35 U.S.C. § 119, the content of which in its entirety is herein incorporated by reference.

BACKGROUND

1. Field

The disclosure relates to a display device and method of manufacturing the display device.

2. Description of the Related Art

In an display device, as the display device includes wires and electrodes including metal, external light incident on the display device may be reflected from the wires and electrodes. Accordingly, the display device generally includes a polarizing plate to prevent reflection by external light.

SUMMARY

In a display device including a polarizing plate to prevent reflection by external light, light efficiency of the display device may be reduced due to the polarizing plate. Accordingly, research is being conducted to prevent reflection by external light without using a polarizing plate.

Embodiments provide a display device with improved display quality and high durability.

Embodiments provide a method of manufacturing the display device.

A display device according to an embodiment includes a display panel including a substrate, a driving device disposed on the substrate, and a light emitting device disposed on the substrate and electrically connected to the driving device, a window disposed on the display panel, a printed layer disposed between the display panel and the window, where the printed layer includes a light blocking material, a first functional layer disposed between the display panel and the window, a second functional layer disposed on the window, a third functional layer disposed on the second functional layer, and a fourth functional layer disposed on the third functional layer.

In an embodiment, the printed layer may define an opening exposing at least a portion of the window, and the first functional layer may be disposed in the opening.

In an embodiment, the first functional layer may be disposed between the window and the printed layer, and the printed layer defines an opening exposing at least a portion of the first functional layer.

In an embodiment, each of the first functional layer and the second functional layer may include magnesium fluoride ($MgF_2$).

In an embodiment, the first functional layer may further include magnesium oxide (MgO) and yttrium oxyfluoride (YOF).

In an embodiment, the second functional layer may further include magnesium oxide (MgO) and yttrium oxyfluoride (YOF).

In an embodiment, the third functional layer may include a substitutional solid solution of silicon dioxide ($SiO_2$) and aluminum oxide ($Al_2O_3$).

In an embodiment, the substitutional solid solution may be $Si_9Al_2O_{10}$.

In an embodiment, the fourth functional layer may include a compound having a structure in which a highly flexible ether bond is introduced into a per-fluoro-alkyl chain.

In an embodiment, a refractive index of the first functional layer may be in a range of about 1.3 to about 1.5, a refractive index of the second functional layer may be in a range of about 1.3 to about 1.5, a refractive index of the third functional layer may be in a range of about 1.3 to about 1.6, and a refractive index of the fourth functional layer may be in a range of about 1.3 to about 1.4.

In an embodiment, a thickness of the first functional layer may be in a range of about 50 nanometer (nm) to about 150 nm, a thickness of the second functional layer may be in a range of about 50 nm to about 150 nm, a thickness of the third functional layer may be in a range of about 5 nm to about 30 nm, a thickness of the fourth functional layer may be in a range of about 2 nm to about 40 nm, and a thickness of the printed layer may be in a range of about 5 micrometers (μm) to about 20 μm.

In an embodiment, the printed layer may include a first printed layer and a second printed layer disposed under the first printed layer.

In an embodiment, the thickness of a first printed layer may be about 3 μm to about 8 μm, and a thickness of the second printed layer may be about 5 μm to about 10 μm.

In an embodiment, the printed layer may further include a third printed layer disposed under the second printed layer.

In an embodiment, a thickness of the first printed layer may be in a range of about 2 μm to about 5 μm, a thickness of the second printed layer may be in a range of about 3 μm to about 5 μm, and a thickness of the third printed layer may be in a range of about 3 μm to about 5 μm.

In an embodiment, the display panel may further include an anti-reflection layer disposed on the light emitting device and including a light blocking member and at least one color filter.

A method of manufacturing a display device according to an embodiment includes forming a printed layer including a light blocking material under a window, forming a first functional layer under the window, forming a second functional layer on the window, forming a third functional layer on the second functional layer, forming a fourth functional layer on the third functional layer, etching the first functional layer, and attaching a display panel under the printed layer, where the display panel includes a substrate, a driving device disposed on the substrate, and a light emitting device disposed on the substrate and electrically connected to the driving device.

In an embodiment, the forming the first functional layer, the forming the second functional layer, the forming the third functional layer, and the forming the fourth functional layer may be performed in a single chamber.

In an embodiment, the etching the first functional layer may be performed using argon (Ar) at a pressure in a range of about $1\times10^{-5}$ torr to $5\times10^{-5}$ torr.

In an embodiment, the forming the printed layer may include forming a first printed layer under the window and forming a second printed layer under the first printed layer.

In an embodiment, the forming the printed layer may further include forming a third printed layer under the second printed layer.

In an embodiment, each of the first functional layer and the second functional layer may include magnesium fluoride ($MgF_2$), the third functional layer may include a substitutional solid solution obtained by reacting silicon dioxide ($SiO_2$) and aluminum oxide ($Al_2O_3$), and the fourth functional layer may include a compound having a structure in which a highly flexible ether bond is introduced into a per-fluoro-alkyl chain.

In an embodiment, at least one selected from the forming the first functional layer and the forming the second functional layer may include reacting magnesium fluoride ($MgF_2$) and yttrium oxide ($Y_2O_3$).

In an embodiment, at least one selected from the forming the first functional layer, the forming the second functional layer, the forming the third functional layer, and the forming the fourth functional layer may be performed using oxygen ($O_2$) and argon (Ar).

In an embodiment, in at least one selected from the forming the first functional layer, the forming the second functional layer, the forming the third functional layer, and the forming the fourth functional layer, the oxygen ($O_2$) may be provided at a flow rate in a range of 5 standard cubic centimeters per minute (SCCM) to 30 SCCM, and the argon (Ar) may be provided at a flow rate om a range of 5 SCCM to 30 SCCM.

In an embodiment, the forming the first functional layer may be performed after the forming the printed layer, the printed layer may define an opening exposing at least a portion of the window, and the first functional layer may be formed in the opening.

In an embodiment, the forming the printed layer may be performed after the forming the first functional layer, and the printed layer may be disposed under the first functional layer and define an opening exposing at least a portion of the first functional layer.

In the display device according to embodiments, the display device may include the display panel and the window structure disposed on the display panel, and the window structure may have a structure in which the window, the printed layer disposed under the window and including a light blocking material, the first functional layer disposed under the window, and the second to fourth functional layers disposed on the window are stacked. In such embodiments, the display device may have a structure in which functional layers are disposed on opposing sides of the window and a printed layer including a light blocking material is disposed under the window.

Accordingly, reflection by external light may be suppressed and the display device may have desired reflective color. In such an embodiment, a light leakage phenomenon of light emitted from the display panel may be effectively prevented or substantially reduced by the printed layer. Accordingly, display quality of the display device may be improved.

In addition, the window structure may have high abrasion resistance, chemical resistance, and hardness, and in particular, the print layer may have high adhesion and high heat resistance. Accordingly, durability of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
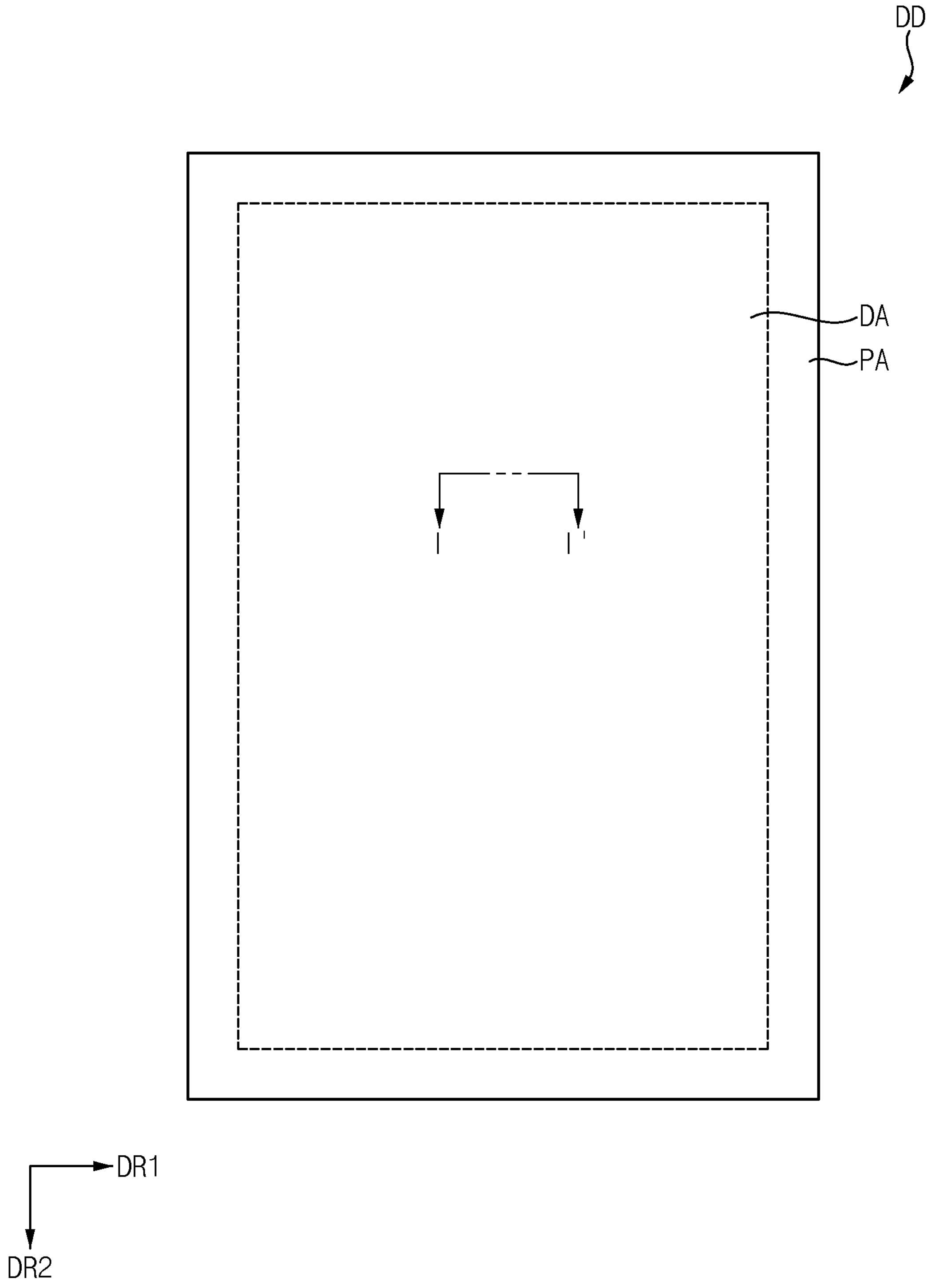
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating a display device according to an embodiment.

Referring to FIG. 1, a display device DD according to an embodiment may be divided into a display area DA and a peripheral area PA. The display area DA may display an image, and the peripheral area PA may be located around the display area DA. In an embodiment, for example, the peripheral area PA may surround the display area DA.

In an embodiment, the display device DD may have a rectangular shape in a plan view. However, the invention is not necessarily limited thereto, and the display device DD may have various shapes in a plan view or on a plane. Here, a plane may be defined by the first direction DR1 and the second direction DR2 intersecting the first direction DR1, an the plan view may be viewed in a direction perpendicular to the plane or a thickness direction of the display device DD.

The display device DD may include a plurality of pixels disposed in the display area DA. In an embodiment, for example, the pixels may be arranged in a matrix form along the first directions DR1 and the second direction DR2.

A driver may be disposed in the peripheral area PA. The driver may provide signals and/or voltages to the pixels. In an embodiment, for example, the driver may include a data driver and a gate driver.

Figure 2:
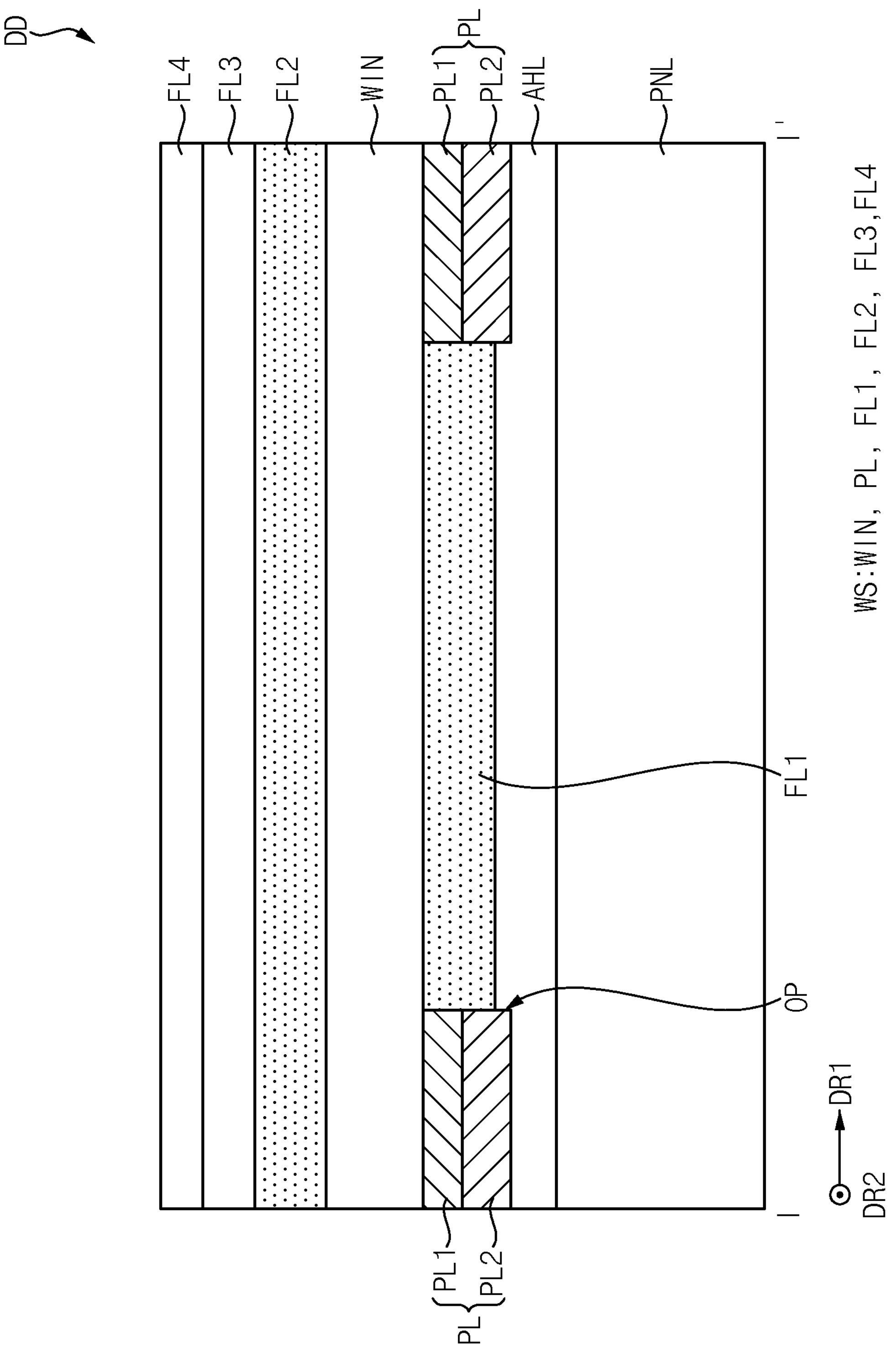
FIG. 2 is a cross-sectional view taken along line I-I' of FIG. 1.
Figure 3:
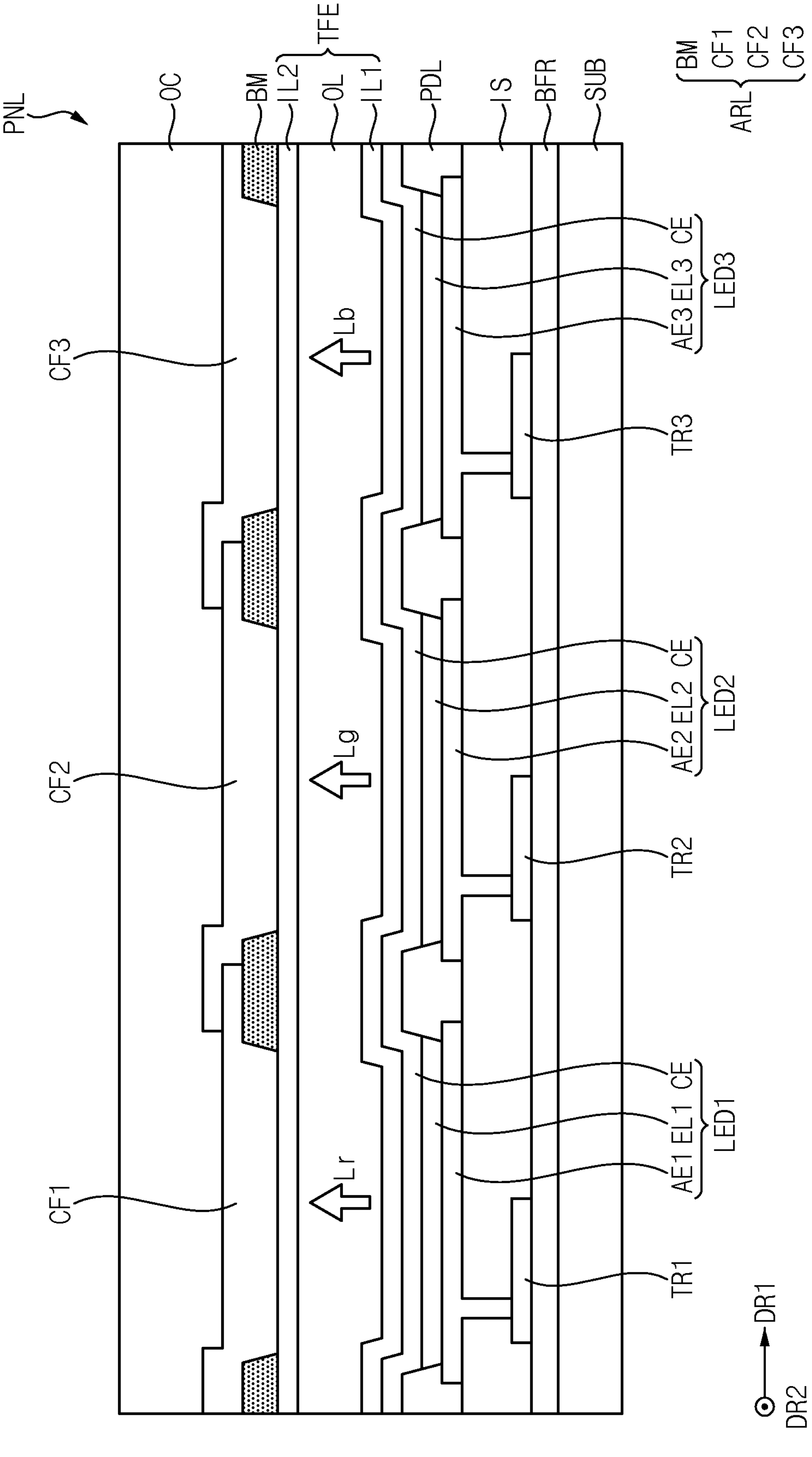
FIG. 3 is a cross-sectional view illustrating a display panel included in the display device of FIG. 2.

FIG. 2 is a cross-sectional view taken along line I-I' of FIG. 1, and FIG. 3 is a cross-sectional view illustrating a display panel included in the display device of FIG. 2.

Referring to FIGS. 2 and 3, an embodiment of the display device DD may include a display panel PNL, a window structure WS, and an adhesive layer AHL.

The display panel PNL may display an image, and the window structure WS may protect the display panel PNL. The window structure WS may be disposed on the display panel PNL. The window structure WS may face the display panel PNL.

The adhesive layer AHL may be disposed between the display panel PNL and the window structure WS. The adhesive layer AHL may bond the display panel PNL and the window structure WS to each other. The adhesive layer AHL may include an adhesive material. In an embodiment, for example, the adhesive layer AHL may include an optically clear adhesive film (OCA), an optically clear resin (OCR), or a pressure sensitive adhesive film (PSA).

In an embodiment, as shown in FIG. 3, the display panel PNL may include a substrate SUB, a buffer layer BFR, first to third driving devices TR1, TR2, TR3, an insulating structure IS, a pixel defining layer PDL, first to third light emitting devices LED1, LED2, and LED3, an encapsulation layer TFE, an anti-reflection layer ARL, and an overcoat layer OC. In an embodiment, the anti-reflection layer ARL may include a light blocking member BM, a first color filter CF1, a second color filter CF2, and a third color filter CF3.

The substrate SUB may include glass, quartz, or plastic. In an embodiment, for example, the substrate SUB may be a plastic substrate and may include polyimide PI. In an embodiment, the substrate SUB may have a structure in which at least one polyimide layer and at least one barrier layer are alternately stacked.

The buffer layer BFR may be disposed on the substrate SUB. The buffer layer BFR may include silicon oxide, silicon nitride, or the like. The buffer layer BFR may prevent impurities from diffusing onto the substrate SUB. In an alternative embodiment, the buffer layer BFR may be omitted.

The first to third driving devices TR1, TR2, and TR3 may be disposed on the buffer layer BFR. In an embodiment, each of the first to third driving devices TR1, TR2, and TR3 may include at least one transistor. A channel layer of the transistor may include an oxide semiconductor, a silicon semiconductor, or an organic semiconductor. In an embodiment, for example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include amorphous silicon, polycrystalline silicon, or the like.

The insulating structure IS may cover the first to third driving devices TR1, TR2, and TR3. The insulating structure IS may include a combination of an inorganic insulating layer and an organic insulating layer. In an embodiment, for example, the inorganic insulating layer may include silicon oxide (SiOx), silicon nitride (SiNx), silicon carbide (SiCx), silicon oxynitride (SiOxNy), silicon oxycarbide (SiOxCy), or the like. In addition, the organic insulating layer may include photoresist, polyacryl-based resin, polyimide-based resin, polyamide-based resin, siloxane-based resin, acrylic-based resin, epoxy-based resin, or the like. These may be used alone or in combination with each other.

First to third pixel electrodes AE1, AE2, and AE3 may be disposed on the insulating structure IS. Each of the first to third pixel electrodes AE1, AE2, and AE3 may include a conductive material such as metal, alloy, conductive metal nitride, conductive metal oxide, or transparent conductive material. Each of the first to third pixel electrodes AE1, AE2, and AE3 may have a single-layer structure or a multi-layer structure including a plurality of conductive layers.

The first to third pixel electrodes AE1, AE2, and AE3 may be electrically connected to the first to third driving devices TR1, TR2, and TR3 through contact holes defined or formed in the insulating structure IS, respectively.

The pixel defining layer PDL may be disposed on the first to third pixel electrodes AE1, AE2, and AE3. The pixel defining layer PDL may include an organic insulating material. In an embodiment, the organic insulating material may include photoresist, polyacryl-based resin, polyimide-based resin, polyamide-based resin, siloxane-based resin, acrylic-based resin, epoxy-based resin, or the like. These may be used alone or in combination with each other. The pixel defining layer PDL may define a pixel opening exposing at least a portion of each of the first to third pixel electrodes AE1, AE2, and AE3.

First to third emission layers EL1, EL2, and EL3 may be disposed on the first to third pixel electrodes AE1, AE2, and AE3 exposed by the pixel opening of the pixel defining layer PDL, respectively. In an embodiment, for example, the first emission layer EL1 may be disposed on the first pixel electrode AE1, the second emission layer EL2 may be disposed on the second pixel electrode AE2, and the third emission layer EL3 may be disposed on the third emission layer EL3.

In an embodiment, the first emission layer EL1 may include a light emitting material which emits red light Lr, the second emission layer EL2 may include a light emitting material which emits green light Lg, and the third emission layer EL3 may include a light material which emits blue light Lb. However, the invention is not necessarily limited thereto.

In an embodiment, a hole injection layer, a hole transport layer, an electron transport layer, an electron injection layer, or the like may be disposed above and/or below each of the first to third emission layers EL1, EL2, and EL3.

A common electrode CE may be disposed on the first to third emission layers EL1, EL2, and EL3. The common electrode CE may include a conductive material such as a metal, an alloy, a conductive metal nitride, a conductive metal oxide, or a transparent conductive material. The common electrode CE may have a single-layer structure or a multi-layer structure including a plurality of conductive layers. In an embodiment, the common electrode CE may continuously extend over a plurality of pixels.

The first pixel electrode AE1, the first emission layer EL1, and the common electrode CE may form (or collectively define) the first light emitting device LED1, the second pixel electrode AE2, the second emission layer EL2, and the common electrode CE may form the second light emitting device LED2, and the third pixel electrode AE3, the third emission layer EL3, and the common electrode CE may form the third light emitting device LED3.

In an embodiment, the first light emitting device LED1 may emit red light Lr, the second light emitting device LED2 may emit green light Lg, and the third light emitting device LED3 may emit blue light Lb. However, the invention is not necessarily limited thereto.

In an embodiment, the light emitting device included in the display device DD may not be limited to the first to third light emitting devices LED1, LED2, and LED3. In an embodiment, for example, the light emitting device may be a light emitting device including at least one selected from a micro-light emitting diode (LED), a nano-LED, a quantum dot (QD), and a quantum rod (QR).

The encapsulation layer TFE may be disposed on the common electrode CE. The encapsulation layer TFE may include at least one inorganic encapsulation layer and at least one organic encapsulation layer. In an embodiment, the encapsulation layer TFE may include a first inorganic encapsulation layer IL1 disposed on the common electrode CE, an organic encapsulation layer OL disposed on the first inorganic encapsulation layer IL1, and a second inorganic encapsulation layer IL2 disposed on the organic encapsulation layer OL.

In an embodiment, the first color filter CF1 may selectively transmit red light Lr, the second color filter CF2 may selectively transmit green light Lg, and the third color filter CF3 may selectively transmit blue light Lb. However, the invention is not necessarily limited thereto. The light blocking member BM may be disposed between the color filters.

In an embodiment, the light blocking member BM may absorb external light. Accordingly, the light blocking member BM may reduce reflectance of the external light of the display device DD. In an embodiment, for example, a material included in the light blocking member BM may include chromium (Cr), chromium oxide (CrOx), chromium nitride (CrNx), carbon black, a black pigment mixture, or a black dye mixture. These may be used alone or in combination with each other.

In such an embodiment, the first color filter CF1, the second color filter CF2, the third color filter CF3, and the light blocking member BM may form or collectively define the anti-reflection layer ARL. Accordingly, in such an embodiment, a polarizing plate may be omitted, such that a structure of the display device DD may be simplified.

Although FIG. 3 illustrates an embodiment where the first to third color filters CF1, CF2, and CF3 are included in the display panel PNL, the invention is not necessarily limited thereto, and in an alternative embodiment, at least one selected from the first color filters CF1, the second color filter CF2, and the third color filter CF3 may be omitted. In an embodiment, for example, the first color filter CF1, the second color filter CF2, and the third color filter CF3 may all be omitted.

The overcoat layer OC may be disposed on the anti-reflection layer ARL. The overcoat layer OC may include an organic material and/or an inorganic material. In an embodiment, for example, a material included in the overcoat layer OC may include polyimide, acryl, silicon oxide, silicon nitride, or the like. These may be used alone or in combination with each other.

In an embodiment, although not shown, a touch layer may be disposed between the encapsulation layer TFE and the anti-reflection layer ARL. In an embodiment, the touch layer may include at least one touch electrode and at least one touch insulating layer. The touch electrode may include a metal, an alloy, a conductive metal oxide, a transparent conductive material, or the like. The touch insulating layer may include an organic material and/or an inorganic material.

In an embodiment, as shown in FIG. 2, the window structure WS may include a window WIN, a printed layer PL, a first functional layer FL1, a second functional layer FL2, a third functional layer FL3, and a fourth functional layer FL4.

The window WIN may be disposed on the display panel PNL. The window WIN may cover an entire surface of the display panel PNL. The window WIN may protect the display panel PNL from an external impact or penetration of foreign matter. The window WIN may include a transparent material. In an embodiment, for example, the window WIN may include glass or plastic.

The printed layer PL may be disposed under the window WIN. In an embodiment, for example, the printed layer PL may be disposed between the display panel PNL and the window WIN. In an embodiment, the printed layer PL be provided with an opening OP exposing at least a portion of the window WIN. In an embodiment, the printed layer PL may correspond to the peripheral area PA, and the opening OP may correspond to the display area DA.

The printed layer PL may include an organic material and/or an inorganic material. In an embodiment, for example, the organic material included in the print layer PL may include photoresist, polyacrylic resin, polyimide resin, polyamide resin, siloxane resin, acrylic resin, epoxy resin, urethane resin, or the like. These may be used alone or in combination with each other.

In an embodiment, the printed layer PL may further include a light blocking material. In an embodiment, for example, the light blocking material included in the printed layer PL may include black pigment, dye, carbon black, or the like. These may be used alone or in combination with each other. Accordingly, the printed layer PL may effectively prevent or substantially reduce a light leakage phenomenon of light emitted from the display panel PNL.

In an embodiment, the printed layer PL may include a plurality of printed layers. In an embodiment, for example, the printed layer PL may include a first printed layer PL1 and a second printed layer PL2. In such an embodiment, the printed layer PL may be formed by two-tone printing. However, the invention is not necessarily limited thereto, and alternatively, the printed layer PL may have a multilayer structure of three or more layers. In such an embodiment, the printed layer PL may be formed by three or more-tone printing. This will be described later in greater detail with reference to FIGS. 8 and 9.

In an embodiment, a thickness of the first printed layer PL1 may be in a range of about 3 micrometers (μm) to about 8 μm. The first printed layer PL1 may include an organic material and/or an inorganic material. In an embodiment, for example, the organic material included in the first printed layer PL1 may include polyester-based resins, polyacrylic-based resins, polyimide-based resins, polyamide-based resins, siloxane-based resins, acrylic resins, epoxy-based resins, urethane-based resins, or the like. These may be used alone or in combination with each other. The first printed layer PL1 may further include a light blocking material.

In an embodiment, a thickness of the second printed layer PL2 may be in a range of about 5 μm to about 10 μm. The second printed layer PL2 may include an organic material and/or an inorganic material. In an embodiment, for example, the organic material included in the second printed layer PL2 may include polyester-based resin, polyacrylic-based resin, polyimide-based resin, polyamide-based resin, siloxane-based resin, acrylic resin, epoxy-based resin, urethane-based resin, or the like. These may be used alone or in combination with each other. The second printed layer PL2 may further include a light blocking material.

In an embodiment, for example, the first printed layer PL1 may include an acrylic resin, and the second printed layer PL2 may include an epoxy resin. In an alternative embodiment, for example, the first printed layer PL1 may include a polyester-based resin, and the second printed layer PL2 may include an epoxy-based resin. However, the invention is not necessarily limited thereto.

The first functional layer FL1 may be disposed under the window WIN. In an embodiment, for example, the first functional layer FL1 may be disposed between the display panel PNL and the window WIN. In an embodiment, the first functional layer FL1 may be disposed in the opening OP of the printed layer PL.

In an embodiment, the first functional layer FL1 may include a magnesium compound. In an embodiment, for example, the magnesium compound included in the first functional layer FL1 may include magnesium fluoride ($MgF_2$), magnesium oxide (MgO), or the like. These may be used alone or in combination with each other. In an embodiment, for example, the first functional layer FL1 may include magnesium fluoride (MgF2).

In an embodiment, the first functional layer FL1 may further include an ytterbium compound. The ytterbium compound may include yttrium oxyfluoride (YOF). Yttrium oxyfluoride (YOF) may have a cubic structure, a tetragonal structure, or a rhombohedral structure. In an embodiment, for example, the first functional layer FL1 may be a single layer in which magnesium fluoride ($MgF_2$), magnesium oxide (MgO), and yttrium oxyfluoride (YOF) are mixed.

In an embodiment, the first functional layer FL1 may include an aluminum compound or a silicon compound.

The first functional layer FL1 may have a refractive index in a range of about 1.3 to about 1.5 for light in a visible ray wavelength band. In an embodiment, for example, the refractive index of the first functional layer FL1 for light having a wavelength of about 550 nm may be in a range of about 1.3 to about 1.5. The first functional layer FL1 may effectively reduce reflection by external light due to its low refractive index.

A thickness of the first functional layer FL1 may be greater than a thickness of the third functional layer FL3 and a thickness of the fourth functional layer FL4. In an embodiment, for example, the thickness of the first functional layer FL1 may be in a range of about 50 nm to about 150 nm. In such an embodiment where the thickness of the first functional layer FL1 is in the above range, reflection by external light may be further reduced.

The second functional layer FL2 may be disposed on the window WIN. In an embodiment, for example, the window WIN may be disposed between the first functional layer FL1 and the second functional layer FL2.

In an embodiment, the second functional layer FL2 may include a magnesium compound. In an embodiment, for example, the magnesium compound included in the second functional layer FL2 may include magnesium fluoride ($MgF_2$), magnesium oxide (MgO), or the like. These may be used alone or in combination with each other. In an embodiment, for example, the second functional layer FL2 may include magnesium fluoride ($MgF_2$).

In an embodiment, the second functional layer FL2 may further include an ytterbium compound. The ytterbium compound may include yttrium oxyfluoride (YOF). Yttrium oxyfluoride (YOF) may have a cubic structure, a tetragonal structure, or a rhombohedral structure. In an embodiment, for example, the second functional layer FL2 may be a single layer in which magnesium fluoride ($MgF_2$), magnesium oxide (MgO), and yttrium oxyfluoride (YOF) are mixed.

In an embodiment, the second functional layer FL2 may include an aluminum compound or a silicon compound.

The second functional layer FL2 may have a refractive index in a range of about 1.3 to about 1.5 for light in a visible ray wavelength band. In an embodiment, for example, the refractive index of the second functional layer FL2 for light having a wavelength of about 550 nm may be in a range of about 1.38 to about 1.4. The second functional layer FL2 may effectively reduce reflection by external light due to its low refractive index.

A thickness of the second functional layer FL2 may be greater than a thickness of the third functional layer FL3 and a thickness of the fourth functional layer FL4. In an embodiment, for example, the thickness of the second functional layer FL2 may be in a range of about 50 nm to about 150 nm. In such an embodiment where the thickness of the second functional layer FL2 is in the above range, reflection by external light may be further reduced.

The third functional layer FL3 may be disposed on the second functional layer FL2. In an embodiment, for example, the second functional layer FL2 may be disposed between the window WIN and the third functional layer FL3.

In an embodiment, the third functional layer FL3 may include a silicon compound and an aluminum compound. In an embodiment, for example, the third functional layer FL3 may be obtained by reacting the silicon compound and the aluminum compound. In an embodiment, the third functional layer FL3 may include a substitutional solid solution obtained by reacting the silicon compound and the aluminum compound. In an embodiment, for example, the substitutional solid solution may be a substitutional solid solution of silicon dioxide ($SiO_2$) and aluminum oxide ($Al_2O_3$). In an embodiment, for example, the substitutional solid solution may be $Si_9Al_2O_{10}$. The substitutional solid solution may have a stable chemical bond, be stably coated, and form a high-density thin film.

The third functional layer FL3 may firmly attach to the second functional layer FL2 and the fourth functional layer FL4. The third functional layer FL3 may have a refractive index in a range of about 1.3 to about 1.6 for light in a visible ray wavelength band. In an embodiment, for example, the refractive index of the third functional layer FL3 for light having a wavelength of about 550 nm may be in a range of about 1.44 to about 1.52. The third functional layer FL3 may have a thickness in a range of about 5 nm to about 30 nm, e.g., in a range of about 5 nm to about 25 nm.

The fourth functional layer FL4 may be disposed on the third functional layer FL3. The fourth functional layer FL4 may have high anti-fingerprint properties and high slip properties. The fourth functional layer FL4 may have a refractive index in a range of about 1.3 to 1.4 for light in a visible ray wavelength band. In an embodiment, for example, the refractive index of the fourth functional layer FL4 for light having a wavelength of about 550 nm may be in a range of about 1.3 to about 1.34. in an embodiment, the fourth functional layer FL4 may have a low refractive index and suppress abrasion of the surface. In an embodiment, the fourth functional layer FL4 may include a PFPE compound. The PFPE compound may have a structure in which a highly flexible ether bond is introduced into a per-fluoro-alkyl chain.

The display device DD according to embodiments may include the display panel PNL and the window structure WS disposed on the display panel PNL, and the window structure WS may have a structure in which the window WIN, the printed layer PL disposed under the window WIN and including a light blocking material, the first functional layer FL1 disposed under the window WIN, and the second to fourth functional layers FL2, FL3, and FL4 disposed on the window WIN are stacked. Accordingly, reflection by external light may be suppressed and the display device DD may have desired reflective color. Accordingly, display quality of the display device DD may be improved.

In an embodiment, for example, reflectance of opposing sides of the window structure WS measured in a specular component included (SCI) mode may be in a range of about 4.0% to about 5.0%, e.g., in a range of about 4.0% to about 4.5%. In addition, a cross-sectional reflectance of the window structure WS measured in a specular component included (SCI) mode may be about 1.0% or less. Accordingly, display quality of the display device DD may be improved.

Also, in a CIE-Lab color coordinate system, a* value of the window structure WS may be in a range of about −2 to about 2, and b* value of the window structure WS may be in a range of about 0 to about 3.5. Here, the CIE-Lab color coordinate system is a coordinate system representing a reflected color, and uses a* value as a horizontal axis and b* value as a vertical axis, and a positive a* value represents red, negative a* value represents green, positive b* value represents yellow, negative b* value represents blue, and the higher absolute values of a* and b*, the darker the color. In addition, L* value represents brightness, L* value of 0 represents black, and L* value of 100 represents white. Each of a* value and b* value of the window structure WS is reflectance measured in a specular component excluded (SCE) mode.

When a reflected color of the window structure WS is in the aforementioned range, the display device DD may have a structure in which a product of b* value of the display panel PNL and b* value of the window structure WS may be a negative number. That is, since a reflective color of the display panel PNL is close to blue and a reflective color of the window structure WS is close to yellow, a reflective color of the display device DD may be corrected. Accordingly, the display device DD may have desired or improved reflective color.

In addition, in the display device DD according to embodiments, as the first functional layer FL1 is disposed under the window WIN, the second to fourth functional layers FL2, FL3, and FL4 are disposed on the window WIN, and the printed layer PL including a light blocking material is disposed under the window WIN, durability of the display device DD may be improved.

In an embodiment, for example, when performing an eraser abrasion resistance test on the window structure WS, water contact angle of the window structure WS may be about 95 degrees or greater. The eraser abrasion resistance test was performed by measuring water contact angle of a surface of the fourth functional layer FL4 after reciprocating a rubber eraser 10,000 times at a reciprocating speed of 40 times/min and a stroke distance of 15 mm under a load of 1 kg on the surface of the fourth functional layer FL4. When physical properties of the window structure WS is in the above range, the window structure WS may have high abrasion resistance. Accordingly, durability of the display device DD may be improved.

In addition, when performing a steel wool abrasion resistance test on the window structure WS, water contact angle of the window structure WS may be about 95 degrees or greater. A steel wool abrasion resistance test was performed by measuring water contact angle of the surface of the fourth functional layer FL4 after reciprocating a steel wool measuring instrument 5,000 times at a reciprocating speed of 40 times/min and a stroke distance of 15 mm on the surface of the fourth functional layer FL4. When physical properties of the window structure WS is in the above range, the window structure WS may have high abrasion resistance. Accordingly, durability of the display device DD may be improved.

In addition, when performing a chemical resistance test on the window structure WS, water contact angle of the window structure WS may be about 95 degrees or greater. The chemical resistance test was performed in a same manner as the eraser abrasion resistance test after ethanol (purity of 99.99%) is applied to the surface of the fourth functional layer FL4. When physical properties of the window structure WS is in the above range, the window structure WS may have high chemical resistance. Accordingly, durability of the display device DD may be improved.

Further, a hardness measured on the surface of the fourth functional layer FL4 by the Berkovich indenter hardness test may be about 8 gigapascals (Gpa) or greater. In an embodiment, for example, the hardness measured on the surface of the fourth functional layer FL4 by the Berkovich indenter hardness test may be about 8.9 Gpa. When physical properties of the window structure WS is in the above range, the window structure WS may have high abrasion resistance and chemical resistance. Accordingly, durability of the display device DD may be improved.

In addition, in the display device DD according to embodiments, a light leakage phenomenon of light emitted from the display panel PNL may be effectively prevented or substantially reduced by disposing the printed layer PL including the light blocking material under the window WIN. In addition, the print layer PL may have high adhesion and high heat resistance.

In an embodiment, for example, the print layer PL may have high adhesion to the window WIN both before and after a process of forming the first functional layer FL1 under the window WIN, which will be described later. In an embodiment, for example, the printed layer PL may have high adhesion to the window WIN both before and after the forming the first functional layer FL1 performed at a temperature of about 150° C. In addition, the print layer PL may have high adhesion to the window WIN both before and after being left in distilled water at about 80° C. for about 30 minutes.

In addition, color difference ΔE of the window structure WS both before and after the printed layer PL is left in distilled water at about 80° C. for about 30 minutes may be about 0.5 or less. Accordingly, the window structure WS may have desired or improved color shift characteristics. Here, color difference (ΔE) is calculated by a following equation 1 using X-rite's Color i7 color difference meter.

$$\Delta E*_{ab} = [(\Delta L*)^2 + (\Delta a*)^2 + (\Delta b*)^2]^{1/2} \qquad \text{[Equation 1]}$$

In Equation 1, color difference (ΔE) d an index representing a difference between two points in the CIE-Lab color coordinate system. In other words, color difference (ΔE) represents a degree of color shift, and the smaller color difference (ΔE), the better the color shift characteristics.

Figure 4:
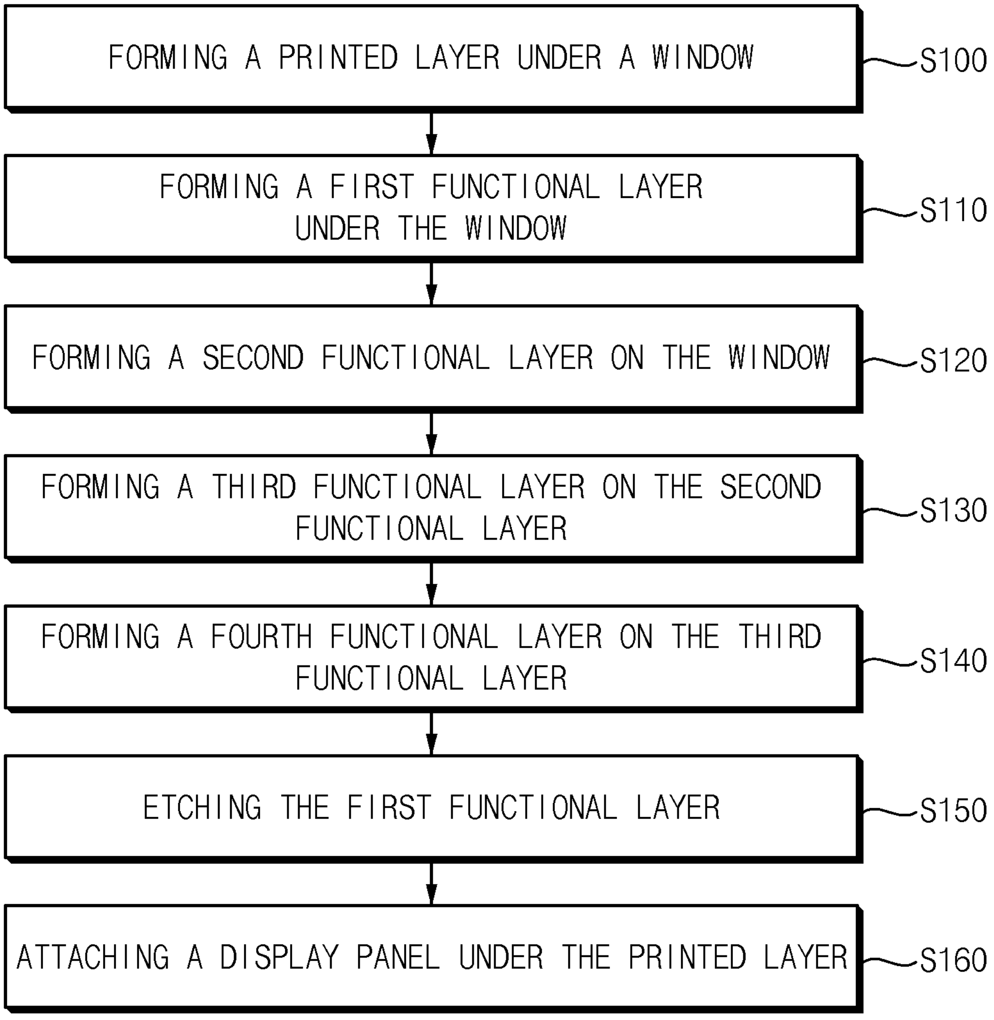
FIG. 4 is a flowchart illustrating an embodiment of manufacturing method of the display device of FIG. 1.

FIG. 4 is a flowchart illustrating an embodiment of a manufacturing method of the display device of FIG. 1.

Hereinafter, an embodiment of a manufacturing method of the display device DD will be described with reference to FIGS. 1, 2, and 4.

In such an embodiment, a printed layer PL may be formed or provided under a window WIN (S100). The printed layer PL may be formed with the opening OP exposing at least a portion of the window WIN.

In an embodiment, the printed layer PL may be formed to include an organic material and/or an inorganic material. Examples of the organic material that can be used to form the print layer PL may include photoresist, polyacrylic resin, polyimide resin, polyamide resin, siloxane resin, acrylic resin, epoxy resin, urethane resin, or the like. These may be used alone or in combination with each other.

In an embodiment, the printed layer PL may be formed to further include a light blocking material. Examples of the light blocking material that can be used to form the printed layer PL may include black pigment, dye, carbon black, or the like.

In an embodiment, the printed layer PL may be formed by two-tone printing. That is, the printed layer PL may be formed to have a two-layer structure. In an embodiment, for example, the printed layer PL may be formed by printing a first printed layer PL1 with a first ink composition and printing a second printed layer PL2 with a second ink composition. However, the invention is not necessarily limited thereto, and the printed layer PL may be formed by three or more-tone printing.

In an embodiment, the first ink composition may include an acrylic resin, and the second ink composition may include an epoxy resin. However, the invention is not necessarily limited thereto, and in an alternative embodiment, the first ink composition may include a polyester-based resin, and the second ink composition may include an epoxy-based resin.

Thereafter, a first functional layer FL1 may be formed or provided under the window WIN (S110). In an embodiment, the first functional layer FL1 may be formed in the opening OP of the printed layer PL.

In an embodiment, the first functional layer FL1 may include a magnesium compound. In an embodiment, for example, the first functional layer FL1 may include magnesium fluoride ($MgF_2$).

In an embodiment, the first functional layer FL1 may be a single layer in which magnesium fluoride ($MgF_2$), magnesium oxide (MgO), and yttrium oxyfluoride (YOF) are mixed. In an embodiment, for example, the first functional layer FL1 having a single-layer structure in which magnesium fluoride ($MgF_2$), magnesium oxide (MgO) and yttrium oxyfluoride (YOF) are mixed may be formed by reacting magnesium fluoride ($MgF_2$) and yttrium oxide ($Y_2O_3$).

In an embodiment, a reaction of magnesium fluoride ($MgF_2$) and yttrium oxide ($Y_2O_3$) may be performed under argon (Ar) and oxygen ($O_2$) atmosphere. In such an embodiment, the reaction may be performed at a temperature in a range of about 140° C. to about 160° C., e.g., about 150° C. In this case, oxygen ($O_2$) may be provided at a flow rate in a range of about 5 standard cubic centimeters per minute (SCCM) to about 30 SCCM, and argon (Ar) may be provided at a flow rate in a range of about 5 SCCM to about 30 SCCM. Oxygen ($O_2$) and argon (Ar) may increase kinetic energy of deposited particles in a process of forming the first functional layer FL1. Accordingly, deposition of the first functional layer FL1 may be more effectively performed.

Thereafter, a second functional layer FL2 may be formed or provided on the window WIN (S120). In an embodiment, the second functional layer FL2 may include a magnesium compound. In an embodiment, for example, the second functional layer FL2 may include magnesium fluoride ($MgF_2$).

In an embodiment, the second functional layer FL2 may be a single layer in which magnesium fluoride ($MgF_2$), magnesium oxide (MgO), and yttrium oxyfluoride (YOF) are mixed. In an embodiment, for example, the second functional layer FL2 having a single-layer structure in which magnesium fluoride ($MgF_2$), magnesium oxide (MgO) and yttrium oxyfluoride (YOF) are mixed may be formed by reacting magnesium fluoride ($MgF_2$) and yttrium oxide ($Y_2O_3$).

In an embodiment, a reaction of magnesium fluoride ($MgF_2$) and yttrium oxide ($Y_2O_3$) may be performed under argon (Ar) and oxygen ($O_2$) atmosphere. In this case, the reaction may be performed at a temperature in a range of about 140° C. to about 160° C., e.g., about 150° C. In this case, oxygen ($O_2$) may be provided at a flow rate in a range of about 5 SCCM to about 30 SCCM and argon (Ar) may be provided at a flow rate in a range of about 5 SCCM to about 30 SCCM. Oxygen ($O_2$) and argon (Ar) may increase kinetic energy of deposited particles in a process of forming the second functional layer FL2. Accordingly, deposition of the second functional layer FL2 may be more effectively performed.

Thereafter, a third functional layer FL3 may be formed or provided on the second functional layer FL2 (S130). The third functional layer FL3 may be formed by reacting a silicon compound and an aluminum compound. In an embodiment, for example, the third functional layer FL3 may include a substitutional solid solution obtained by reacting the silicon compound and the aluminum compound. In an embodiment, for example, the substitutional solid solution may be a substitutional solid solution of silicon dioxide ($SiO_2$) and aluminum oxide ($Al_2O_3$). Here, the substitutional solid solution may be $Si_9Al_2O_{10}$. The substitutional solid solution may have a stable chemical bond, be stably coated, and form a high-density thin film.

The substitutional solid solution may be obtained by reacting silicon dioxide ($SiO_2$) and aluminum hydroxide ($Al(OH)_3$). In this case, magnesium oxide (MgO) and yttrium oxide ($Y_2O_3$) may be used as catalysts.

In an embodiment, a reaction of silicon dioxide ($SiO_2$) and aluminum hydroxide (Al(OH)3) may be performed under argon (Ar) and oxygen ($O_2$) atmosphere. In such an embodiment, the reaction may be performed at a temperature in a range of about 140° C. to about 160° C., e.g., about 150° C. In this case, oxygen ($O_2$) may be provided at a flow rate in a range of about 5 SCCM to about 30 SCCM, and argon (Ar) may be provided at a flow rate in a range of about 5 SCCM to about 30 SCCM. Oxygen ($O_2$) and argon (Ar) may increase kinetic energy of deposited particles in a process of forming the third functional layer FL3. Accordingly, deposition of the third functional layer FL3 may be more effectively performed.

Thereafter, a fourth functional layer FL4 may be formed or provided on the third functional layer FL3 (S140). The fourth functional layer FL4 may have high anti-fingerprint properties and high slip properties. That is, the fourth functional layer FL4 may have a low refractive index and suppress abrasion of the surface. In an embodiment, the fourth functional layer FL4 may include a PFPE compound. The PFPE compound may have a structure in which a highly flexible ether bond is introduced into a per-fluoro-alkyl chain.

In an embodiment, a process of forming the fourth functional layer FL4 may be performed under argon (Ar) and oxygen ($O_2$) atmosphere. In such an embodiment, the process may be performed at a temperature in a range of about 140° C. to about 160° C., specifically about 150° C. In this case, oxygen ($O_2$) may be provided at a flow rate in a range of about 5 SCCM to about 30 SCCM, and argon (Ar) may be provided at a flow rate in a range of about 5 SCCM to about 30 SCCM. Oxygen ($O_2$) and argon (Ar) may increase kinetic energy of deposited particles in a process of forming the fourth functional layer FL4. Accordingly, deposition of the fourth functional layer FL4 may be more effectively performed.

Accordingly, a window structure WS including the window WIN, the printed layer PL, the first functional layer FL1, the second functional layer FL2, the third functional layer FL3, and the fourth functional layer FL4 may be formed.

In an embodiment, the first functional layer FL1, the second functional layer FL2, the third functional layer FL3, and the fourth functional layer FL4 may be formed in a single chamber. In an embodiment, for example, the first functional layer FL1, the second functional layer FL2, the third functional layer FL3, and the fourth functional layer FL4 may be formed in a single chamber through a deposition process. That is, functional layers above the window WIN and a functional layer under the window WIN may be formed in a single chamber. Accordingly, efficiency of a process of forming the window structure WS may be improved.

In an embodiment, the first functional layer FL1, the second functional layer FL2, the third functional layer FL3, and the fourth functional layer FL4 may be formed simultaneously or sequentially in a single chamber. In such an embodiment where the first functional layer FL1, the second functional layer FL2, the third functional layer FL3, and the fourth functional layer FL4 are formed sequentially, order is not particularly limited. In an embodiment, for example, the first functional layer FL1, the second functional layer FL2, the third functional layer FL3, and the fourth functional layer FL4 may be sequentially formed in this order. In an alternative embodiment, for example, the second functional layer FL2, the third functional layer FL3, the fourth functional layer FL4, and the first functional layer FL1 may be sequentially formed in this order. In another alternative embodiment, for example, the second functional layer FL2, the first functional layer FL1, the third functional layer FL3, and the fourth functional layer FL4 may be sequentially formed in this order.

Thereafter, the first functional layer FL1 may be etched (S150). In an embodiment, the first functional layer FL1 may be etched by an ion etching method. In an embodiment, for example, etching of the first functional layer FL1 may be performed using argon (Ar) at a pressure in a range of about $1\times10^{-5}$ torr to $5\times10^{-5}$ torr. In an embodiment, in a process of etching the first functional layer FL1, a portion of the printed layer PL may also be etched.

After the process of etching the first functional layer FL1, surface energy of the first functional layer FL1 may increase. Accordingly, adhesion between the first functional layer FL1 and the window WIN may be improved. Also, in a process of attaching the display panel PNL and the window structure WS, which will be described later, adhesion between the display panel PNL and the window structure WS may be improved.

Thereafter, the display panel PNL may be attached under the printed layer PL (S160). That is, the window structure WS and the display panel PNL may be bonded to each other. In an embodiment, the window structure WS and the display panel PNL may be bonded to each other through an adhesive layer AHL. The adhesive layer AHL may include an adhesive material. In an embodiment, for example, the adhesive layer AHL may include an optically clear adhesive film (OCA), an optically clear resin (OCR), or a pressure sensitive adhesive film (PSA).

Figure 5:
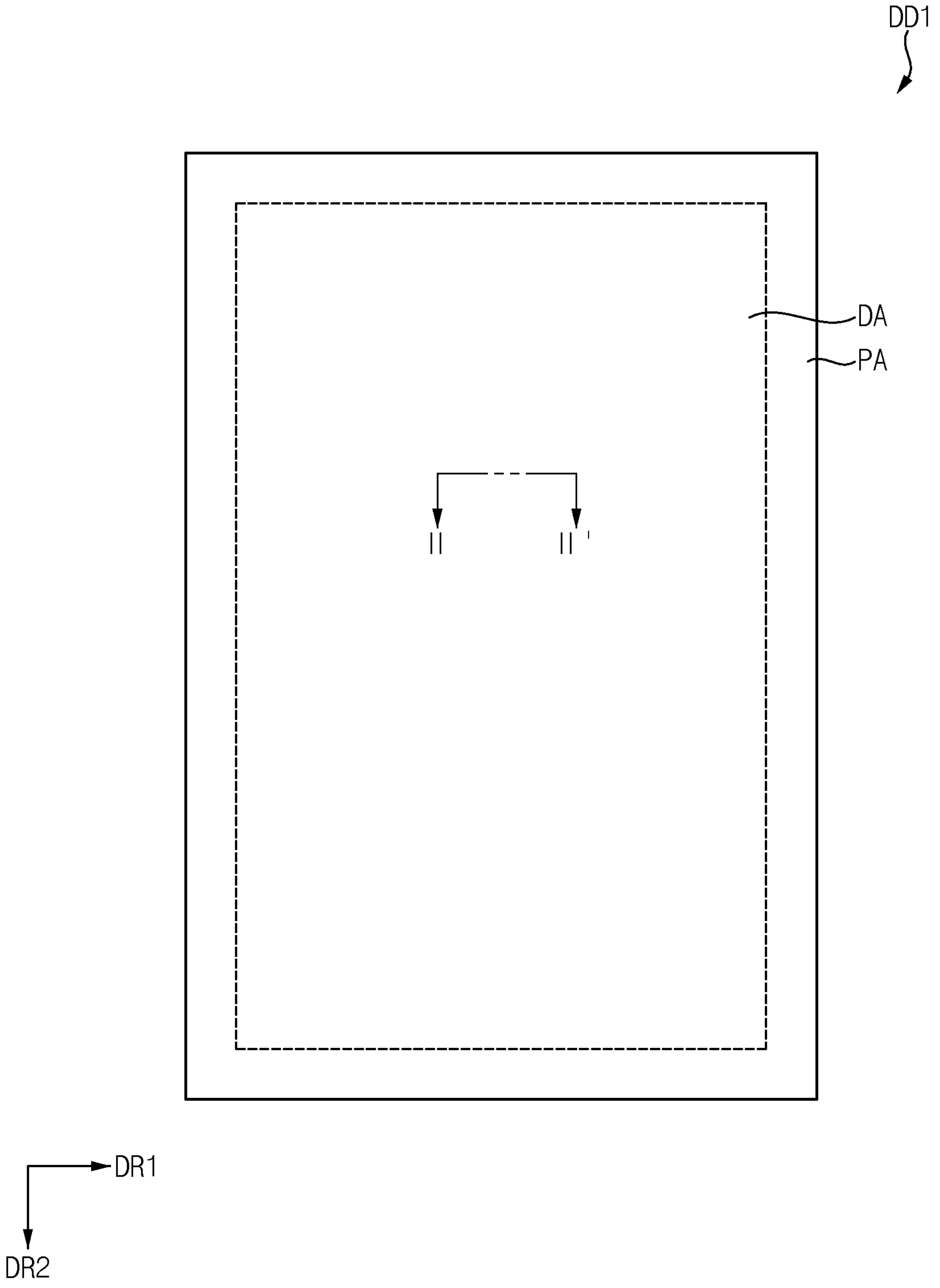
FIGS. 5 and 6 are views illustrating a display device according to an alternative embodiment.
Figure 6:
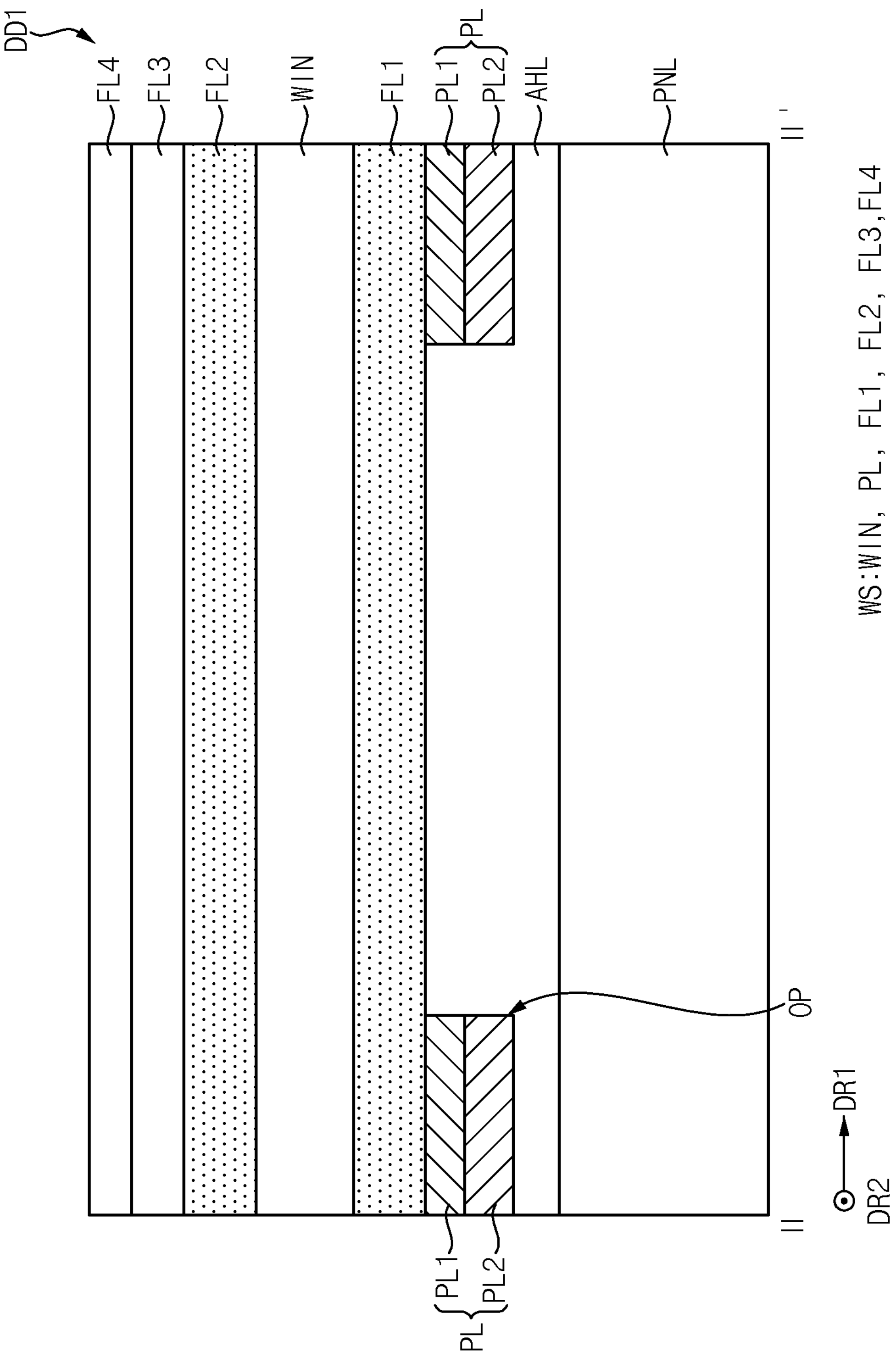

FIGS. 5 and 6 are views illustrating a display device according to an alternative embodiment. Particularly, FIG. 5 may correspond to FIG. 1, and FIG. 6 may correspond to FIG. 5. Specifically, FIG. 6 may be a cross-sectional view taken along line II-II' of FIG. 5.

Referring to FIGS. 5 and 6, a display device DD1 according to an alternative embodiment may be substantially the same as the embodiment of the display device DD described with reference to FIGS. 1 to 3, except for an arrangement of the printed layer PL and the first functional layer FL1. Therefore, any repetitive detailed descriptions of the same or like elements as those described above will be omitted or simplified.

In an embodiment, the first functional layer FL1 may be disposed between the window WIN and the printed layer PL. That is, the first functional layer FL1 may be disposed under the window WIN, and the printed layer PL may be disposed under the first functional layer FL1. In such an embodiment, the opening OP of the printed layer PL may expose at least a portion of the first functional layer FL1.

Figure 7:
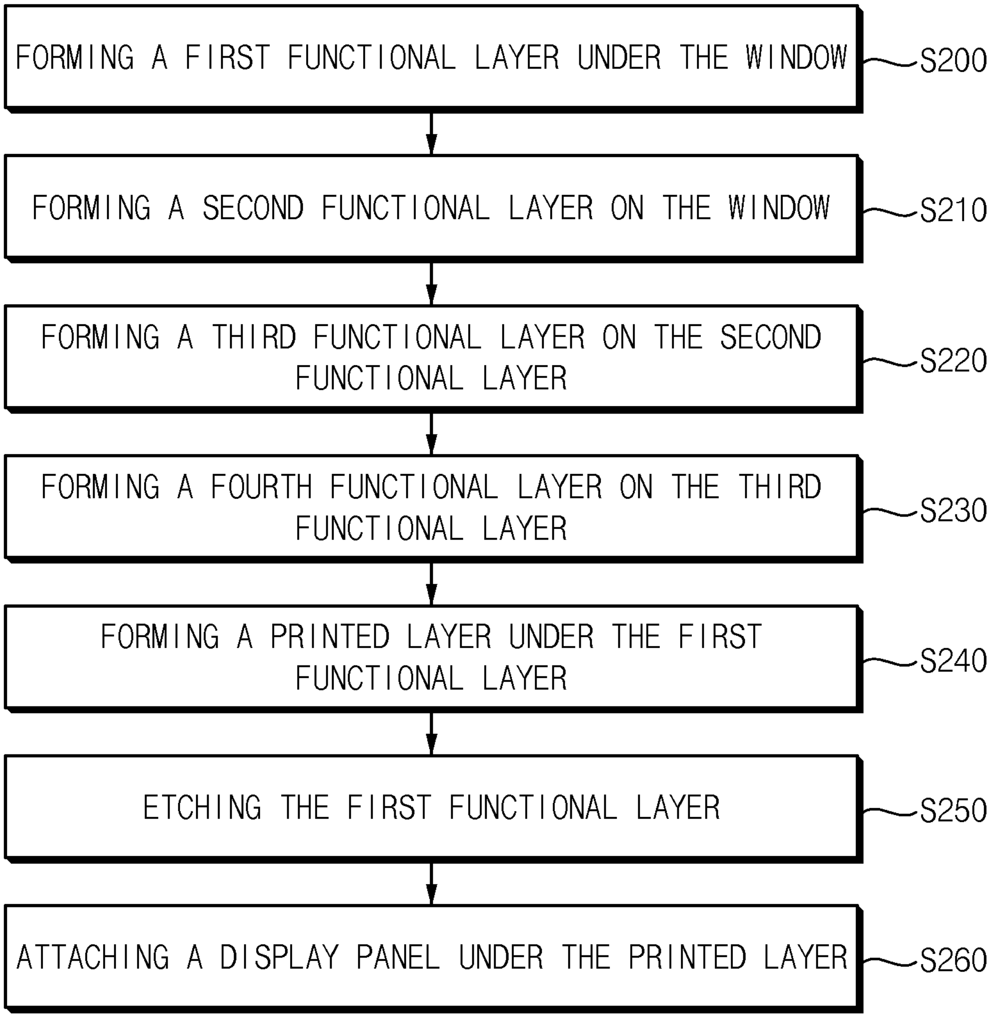
FIG. 7 is a flowchart illustrating an embodiment of a manufacturing method of the display device of FIG. 5.

FIG. 7 is a flowchart illustrating an embodiment of a manufacturing method of the display device of FIG. 5.

Referring to FIGS. 5 to 7, an embodiment of a manufacturing method of the display device DD1 may be substantially the same as the embodiment of the manufacturing method of the display device DD described with reference to FIGS. 1, 2, and 4, except for a process of forming the printed layer PL. Therefore, any repetitive detailed descriptions of the same or like elements as those described above will be omitted or simplified.

In an embodiment, the printed layer PL may be formed after the first functional layer FL1 is formed. In an embodiment, for example, the first functional layer FL1 may be formed under the window WIN (S200), the second functional layer FL2, the third functional layer FL3, and the fourth functional layer FL4 may be formed on the window WIN (S210, 5220, S230), and then the printed layer PL may be formed. That is, the printed layer PL may be formed under the first functional layer FL1 (S240). Thereafter, similar to the manufacturing method of the display device DD described above, the first functional layer FL1 may be etched (S250), and the display panel PNL may be attached under the printed layer PL.

According to an embodiment of the manufacturing the method of the display device DD1, the printed layer PL may be formed after the first functional layer FL1 is formed. Accordingly, the printed layer PL may not be affected by a process of forming the first functional layer FL1. Accordingly, structural reliability of the printed layer PL may be further improved.

Figure 8:
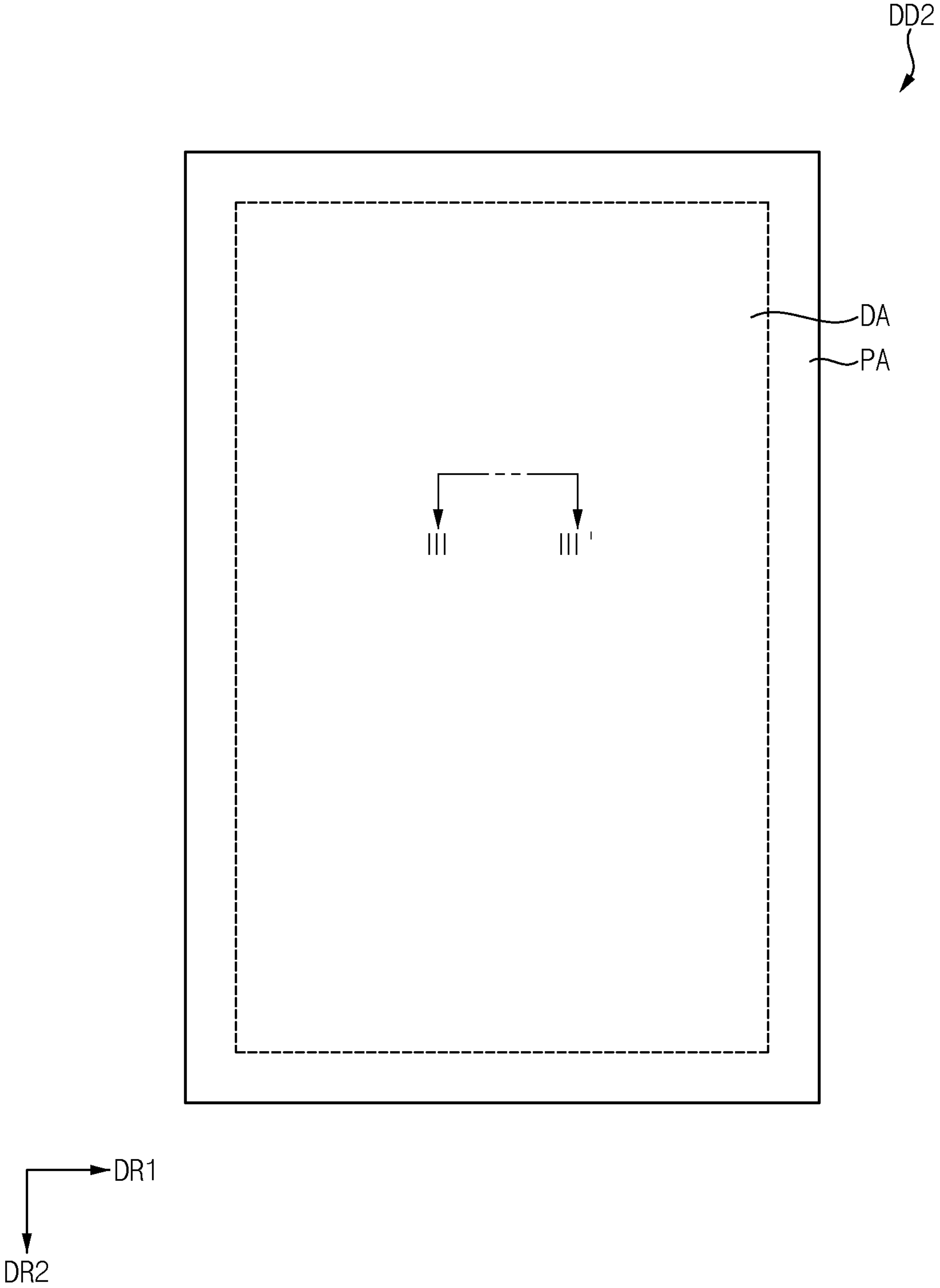
FIGS. 8 and 9 are views illustrating a display device according to another alternative embodiment.
Figure 9:
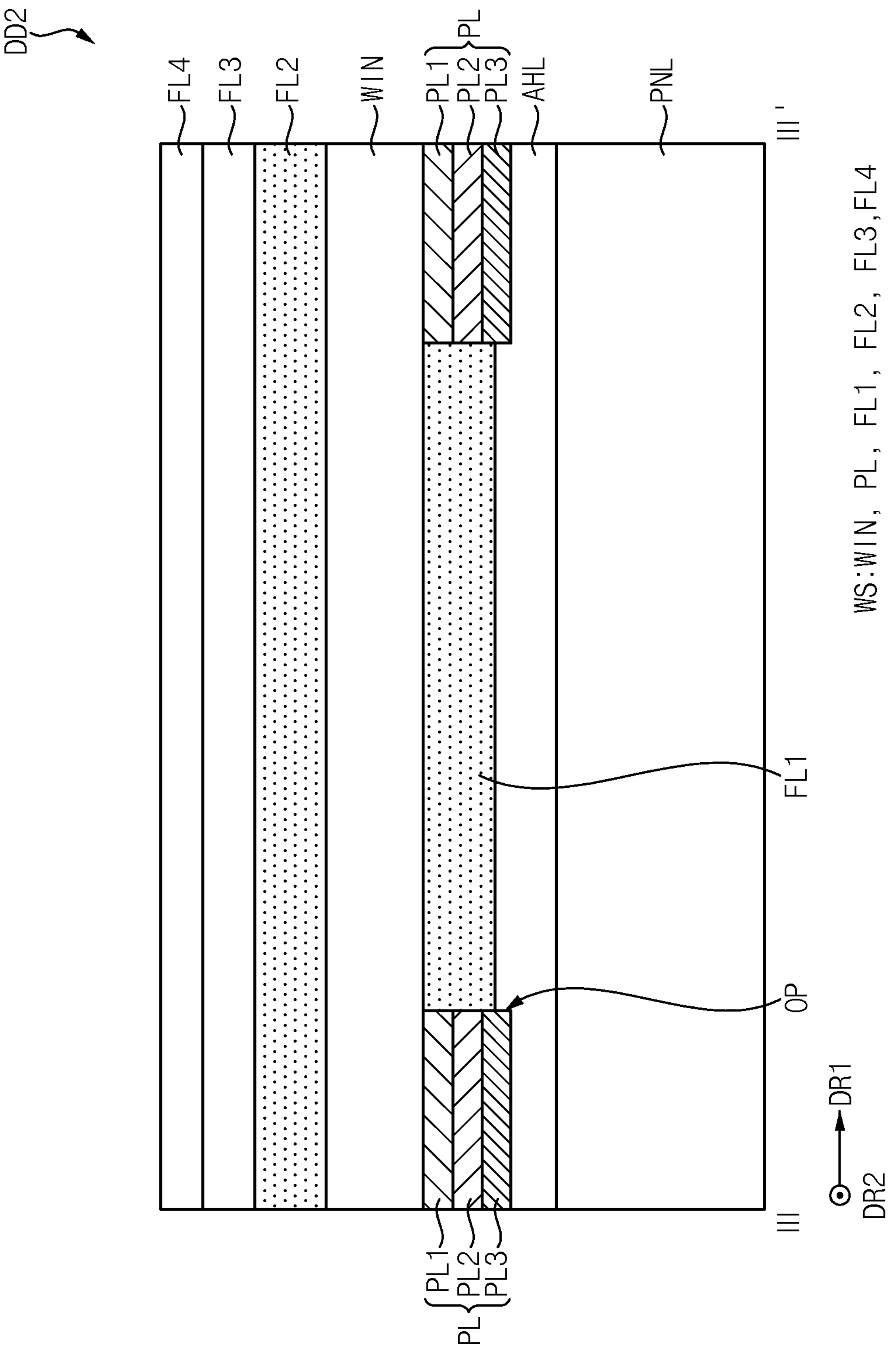

FIGS. 8 and 9 are views illustrating a display device according to another alternative embodiment. Particularly, FIG. 8 may correspond to FIG. 1 and FIG. 9 may correspond to FIG. 2. Specifically, FIG. 9 may be a cross-sectional view taken along line III-III' of FIG. 8.

Referring to FIGS. 8 and 9, a display device DD2 according to another alternative embodiment may be substantially the same as the embodiment of the display device DD described with reference to FIGS. 1 and 2 except for a structure of the printed layer PL.

In an embodiment, the printed layer PL may include a first printed layer PL1, a second printed layer PL2, and a third printed layer PL3. In other words, the printed layer PL may be formed by three-tone printing.

In an embodiment, a thickness of the first printed layer PL1 may be about 2 μm to about 5 μm. The first printed layer PL1 may include an organic material and/or an inorganic material. In an embodiment, for example, the organic material included in the first printed layer PL1 may include polyester-based resins, polyacrylic-based resins, polyimide-based resins, polyamide-based resins, siloxane-based resins, acrylic resins, epoxy-based resins, urethane-based resins, or the like. These may be used alone or in combination with each other. The first printed layer PL1 may further include a light blocking material.

In an embodiment, a thickness of the second printed layer PL2 may be in a range of about 3 μm to about 5 μm. The second printed layer PL2 may include an organic material and/or an inorganic material. In an embodiment, for example, the organic material included in as the second printed layer PL2 may include polyester-based resin, polyacrylic-based resin, polyimide-based resin, polyamide-based resin, siloxane-based resin, acrylic resin, epoxy-based resin, urethane-based resin, or the like. These may be used alone or in combination with each other. The second printed layer PL2 may further include a light blocking material.

In an embodiment, a thickness of the third printed layer PL3 may be in a range of about 3 μm to about 5 μm. The third printed layer PL3 may include an organic material and/or an inorganic material. In an embodiment, for example, the organic material included in the third printed layer PL3 may include polyester-based resins, polyacrylic-based resins, polyimide-based resins, polyamide-based resins, siloxane-based resins, acrylic resins, epoxy-based resins, urethane-based resins, or the like. These may be used alone or in combination with each other. The third printed layer PL3 may further include a light blocking material.

In an embodiment, for example, the first printed layer PL1 may include a polyester-based resin, the second printed layer PL2 may include a polyester-based resin, and the third printed layer PL3 may include an epoxy-based resin. However, the invention is not necessarily limited thereto.

According to embodiments, a display device may include the display panel PNL and the window structure WS disposed on the display panel PNL, and the window structure WS may have a structure in which the window WIN, the printed layer PL disposed under the window WIN and including a light blocking material, the first functional layer FL1 disposed under the window WIN, and the second to fourth functional layers FL2, FL3, and FL4 disposed on the window WIN are stacked. That is, the display device may have a structure in which functional layers are disposed on opposing sides of the window WIN and a printed layer PL including a light blocking material is disposed under the window WIN.

Accordingly, reflection by external light may be suppressed and the display device may have desired reflective color. In addition, a light leakage phenomenon of light emitted from the display panel PNL may be effectively prevented or substantially reduced by the printed layer PL. Accordingly, display quality of the display device may be improved.

In embodiments, the window structure WS may have high abrasion resistance, chemical resistance, and hardness, and in particular, the print layer PL may have high adhesion and high heat resistance. Accordingly, durability of the display device may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a display panel including a substrate, a driving device disposed on the substrate, and a light emitting device disposed on the substrate and electrically connected to the driving device;

a window disposed on the display panel;

a printed layer disposed between the display panel and the window, wherein the printed layer includes a light blocking material;

a first functional layer disposed between the display panel and the window;

a second functional layer disposed on the window;

a third functional layer disposed on the second functional layer; and a fourth functional layer disposed on the third functional layer, wherein each of the first functional layer and the second functional layer includes a magnesium compound.

2. The display device of claim 1, wherein the printed layer defines an opening exposing at least a portion of the window, and wherein the first functional layer is disposed in the opening.

3. The display device of claim 1, wherein the first functional layer is disposed between the window and the printed layer, and wherein the printed layer defines an opening exposing at least a portion of the first functional layer.

4. The display device of claim 1, wherein each of the first functional layer and the second functional layer includes magnesium fluoride ($MgF_2$).

5. The display device of claim 4, wherein the first functional layer further includes magnesium oxide (MgO) and yttrium oxyfluoride (YOF).

6. The display device of claim 5, wherein the second functional layer further includes magnesium oxide (MgO) and yttrium oxyfluoride (YOF).

7. The display device of claim 1, wherein the third functional layer includes a substitutional solid solution of silicon dioxide ($SiO_2$) and aluminum oxide ($Al_2O_3$).

8. The display device of claim 7, wherein the substitutional solid solution is $Si_9Al_2O_{10}$.

9. The display device of claim 1, wherein the fourth functional layer includes a compound having a structure in which a highly flexible ether bond is introduced into a per-fluoro-alkyl chain.

10. The display device of claim 1, wherein a refractive index of the first functional layer is in a range of about 1.3 to about 1.5, a refractive index of the second functional layer is in a range of about 1.3 to about 1.5, a refractive index of the third functional layer is in a range of about 1.3 to about 1.6, and a refractive index of the fourth functional layer is in a range of about 1.3 to about 1.4.

11. The display device of claim 1, wherein a thickness of the first functional layer is in a range of about 50 nm to about 150 nm, a thickness of the second functional layer is in a range of about 50 nm to about 150 nm, a thickness of the third functional layer is in a range of about 5 nm to about 30 nm, a thickness of the fourth functional layer is in a range of about 2 nm to about 40 nm, and a thickness of the printed layer is in a range of about 5 μm to about 20 μm.

12. The display device of claim 1, wherein the printed layer includes:

a first printed layer; and a second printed layer disposed under the first printed layer.

13. The display device of claim 12, wherein a thickness of the first printed layer is in a range of about 3 μm to about 8 μm, and a thickness of the second printed layer is in a range of about 5 μm to about 10 μm.

14. The display device of claim 12, wherein the printed layer further includes:

a third printed layer disposed under the second printed layer.

15. The display device of claim 14, wherein a thickness of the first printed layer is in a range of about 2 μm to about 5 μm, a thickness of the second printed layer is in a range of about 3 μm to about 5 μm, and a thickness of the third printed layer is in a range of about 3 μm to about 5 μm.

16. The display device of claim 1, wherein the display panel further includes an anti-reflection layer disposed on the light emitting device, wherein the anti-reflection layer includes a light blocking member and at least one color filter.

* * * * *